(12) United States Patent
Chakkirala et al.

(10) Patent No.: US 11,275,919 B2
(45) Date of Patent: Mar. 15, 2022

(54) CAPACITANCE MODULATION TO MITIGATE PIXEL LEAKAGE IN ULTRASONIC SENSORS

(71) Applicant: QUALCOMM Incorporated, San Diego, CA (US)

(72) Inventors: Subbarao Surendra Chakkirala, San Jose, CA (US); Sameer Wadhwa, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 307 days.

(21) Appl. No.: 16/696,371

(22) Filed: Nov. 26, 2019

(65) Prior Publication Data

US 2021/0158003 A1    May 27, 2021

(51) Int. Cl.
*G06K 9/20* (2006.01)
*G06K 9/00* (2022.01)
*H03K 17/687* (2006.01)

(52) U.S. Cl.
CPC ....... *G06K 9/0002* (2013.01); *H03K 17/6872* (2013.01); *G06K 9/00973* (2013.01)

(58) Field of Classification Search
CPC ....... G06K 9/0002; G11C 7/10–7/1096; H01L 27/14612–27/14616
See application file for complete search history.

(56) References Cited

U.S. PATENT DOCUMENTS

| | | | |
|---|---|---|---|
| 2017/0079624 A1* | 3/2017 | Wadhwa | G06K 9/0002 |
| 2018/0046836 A1* | 2/2018 | Hinger | G06K 9/0002 |

* cited by examiner

*Primary Examiner* — Brian Werner
(74) *Attorney, Agent, or Firm* — Qualcomm Incorporated

(57) ABSTRACT

Certain aspects of the present disclosure provide apparatus and techniques for capacitance modulation to mitigate pixel leakage in ultrasonic sensors. For example, certain aspects are directed to an ultrasonic sensor including a column line, a pixel having a transistor coupled to the column line, a pixel control circuit coupled to a drain the transistor of the pixel. The ultrasonic sensor may also include a column control circuit coupled to a source of the transistor, wherein at least one of the pixel control circuit or the column control circuit is configured to couple at least one of the drain or the source of the transistor, respectively, to an electric ground during a hold phase of the ultrasonic sensor, and a receiver circuit coupled to the column line.

20 Claims, 4 Drawing Sheets

CAPACITANCE MODULATION TO MITIGATE PIXEL LEAKAGE IN ULTRASONIC SENSORS

BACKGROUND

Field of the Disclosure

Aspects of the present disclosure relate to sensors, and more particularly, to ultrasonic sensors and techniques for operating an ultrasonic sensor.

Description of Related Art

In an ultrasonic sensor system, an ultrasonic transmitter may be used to send (e.g., during a transmission phase) an ultrasonic wave through an ultrasonically transmissive medium or media and towards an object to be detected. The transmitter may be operatively coupled with an ultrasonic sensor (e.g., an ultrasonic receiver) configured to detect (e.g., during a reception phase) portions of the ultrasonic wave that are reflected from the object.

In the context of an ultrasonic fingerprint imager, the ultrasonic wave may travel through a platen on which a person's finger may be placed to obtain a fingerprint image. After passing through the platen, some portions of the ultrasonic wave encounter skin that is in contact with the platen, e.g., fingerprint ridges, while other portions of the ultrasonic wave encounter air, e.g., valleys between adjacent ridges of a fingerprint, and may be reflected with different intensities back towards the ultrasonic sensor. The ultrasonic reflected signals associated with the finger may be processed and converted to a digital value representing the signal strength of the reflected signal. For example, a piezoelectric device may be used to convert the ultrasonic reflection to an electric signal to be sensed by a receiver circuit. When multiple such reflected signals are collected over a distributed area, the digital values of such signals may be used to produce a graphical display of the signal strength over the distributed area, for example by converting the digital values to an image, thereby producing an image of the fingerprint. Thus, an ultrasonic sensor system may be used as a fingerprint imager or other type of biometric scanner.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved ultrasonic sensing.

Certain aspects are directed to an ultrasonic sensor. The ultrasonic sensor generally includes a column line, a pixel having a transistor coupled to the column line, a pixel control circuit coupled to a drain the transistor of the pixel, a column control circuit coupled to a source of the transistor, wherein at least one of the pixel control circuit or the column control circuit is configured to couple at least one of the drain or the source of the transistor, respectively, to an electric ground during a hold phase of the ultrasonic sensor, and a receiver circuit coupled to the column line.

Certain aspects are directed to a method for ultrasonic sensing. The method generally includes receiving a sensor signal at a gate of a transistor of a pixel of an ultrasonic sensor, coupling at least one of a drain or a source of the transistor to an electric ground during a hold phase to store the sensor signal in a capacitive element of the transistor, and reading the stored sensor signal during a sensing phase via a receiver circuit, the sensing phase being after the hold phase.

Certain aspects are directed to an apparatus for ultrasonic sensing. The apparatus generally includes means for receiving a sensor signal at a gate of a transistor of a pixel of the apparatus, means for coupling at least one of a drain or a source of the transistor to an electric ground during a hold phase to store the sensor signal in a capacitive element of the transistor, and means for reading the stored sensor signal during a sensing phase, the sensing phase being after the hold phase.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

Example Mobile Device with Ultrasonic Sensor

Figure 1:
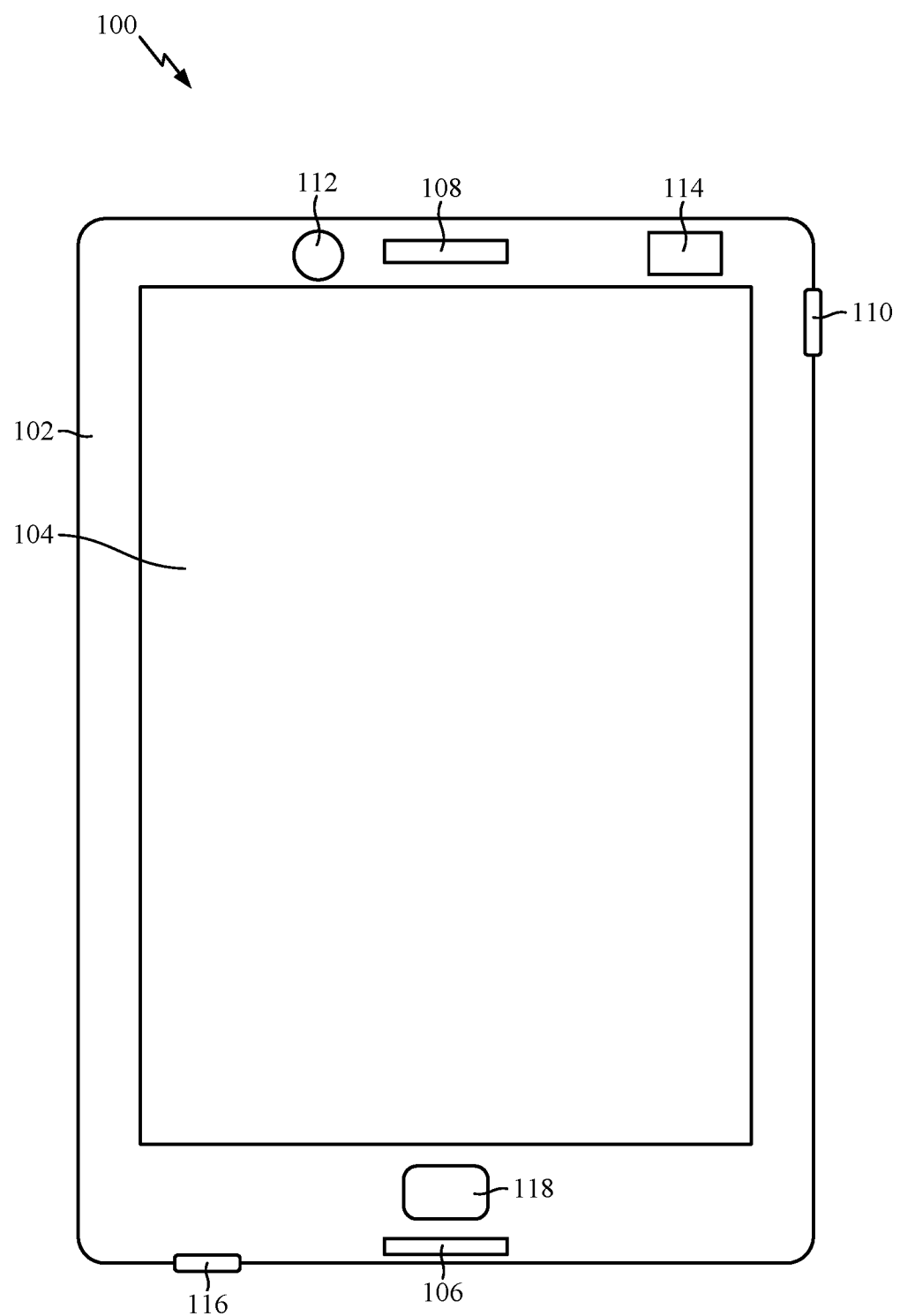
FIG. 1 shows a diagrammatic representation of an example mobile device that includes an ultrasonic sensing system according to some implementations.

FIG. 1 shows a diagrammatic representation of an example mobile device 100 that includes an ultrasonic sensing system according to some implementations. The mobile device 100 may be representative of, for example, various portable computing devices such as cellular phones, smartphones, multimedia devices, personal gaming devices, tablet computers, and laptop computers, among other types of portable computing devices. However, various implementations described herein are not limited in application to portable computing devices. Indeed, various techniques and principles disclosed herein may be applied in traditionally non-portable devices and systems, such as in computer monitors, television displays, kiosks, vehicle navigation devices, and audio systems, among other applications. Additionally, various implementations described herein are not limited in application to devices that include displays.

The mobile device 100 generally includes a housing (or "case") 102 within which various circuits, sensors, and other electrical components reside. In the illustrated example implementation, the mobile device 100 also includes a touchscreen display 104. The mobile device 100 may include various other devices or components for interacting with, or otherwise communicating information to or receiving information from, a user. For example, the mobile device 100 may include one or more microphones 106, one or more speakers 108, and in some cases one or more at least partially mechanical buttons 110. The mobile device 100 may include various other components enabling additional features such as, for example, one or more video or still-image cameras 112, one or more wireless network interfaces 114 (for example, Bluetooth, WiFi, or cellular) and one or more non-wireless interfaces 116 (for example, a universal serial bus (USB) interface or a high-definition multimedia interface (HDMI) interface).

The mobile device 100 may include an ultrasonic sensing system 118 capable of scanning and imaging an object signature, such as a fingerprint, palm print, or handprint. In some implementations, the ultrasonic sensing system 118 may function as a touch-sensitive control button. In some implementations, a touch-sensitive control button may be implemented with a mechanical or electrical pressure-sensitive system that is positioned under or otherwise integrated with the ultrasonic sensing system 118. In other words, in some implementations, a region occupied by the ultrasonic sensing system 118 may function both as a user input button to control the mobile device 100 as well as a fingerprint sensor to enable security features such as user authentication features.

Figure 2A:
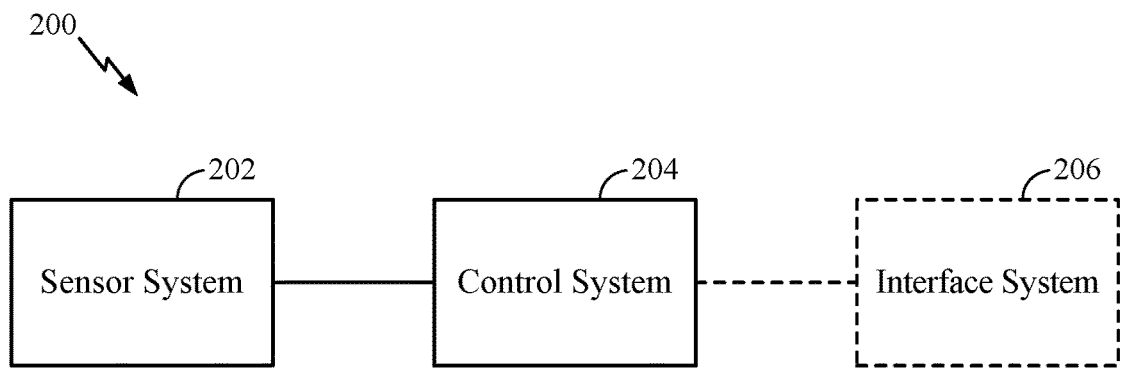
FIG. 2A shows a block diagram representation of components of an example ultrasonic sensing system according to some implementations.

FIG. 2A shows a block diagram representation of components of an example ultrasonic sensing system 200 according to some implementations. As shown, the ultrasonic sensing system 200 may include a sensor system 202 and a control system 204 electrically coupled to the sensor system 202. The sensor system 202 may be capable of scanning an object and providing raw measured image data usable to obtain an object signature, for example, such as a fingerprint of a human finger. The control system 204 may be capable of controlling the sensor system 202 and processing the raw measured image data received from the sensor system. In some implementations, an interface system 206 may be coupled to the control system 204. The interface system 206 may be capable of transmitting or receiving data, such as raw or processed measured image data, to or from various components within or integrated with the ultrasonic sensing system 200 or, in some implementations, to or from various components, devices, or other systems external to the ultrasonic sensing system.

Figure 2B:
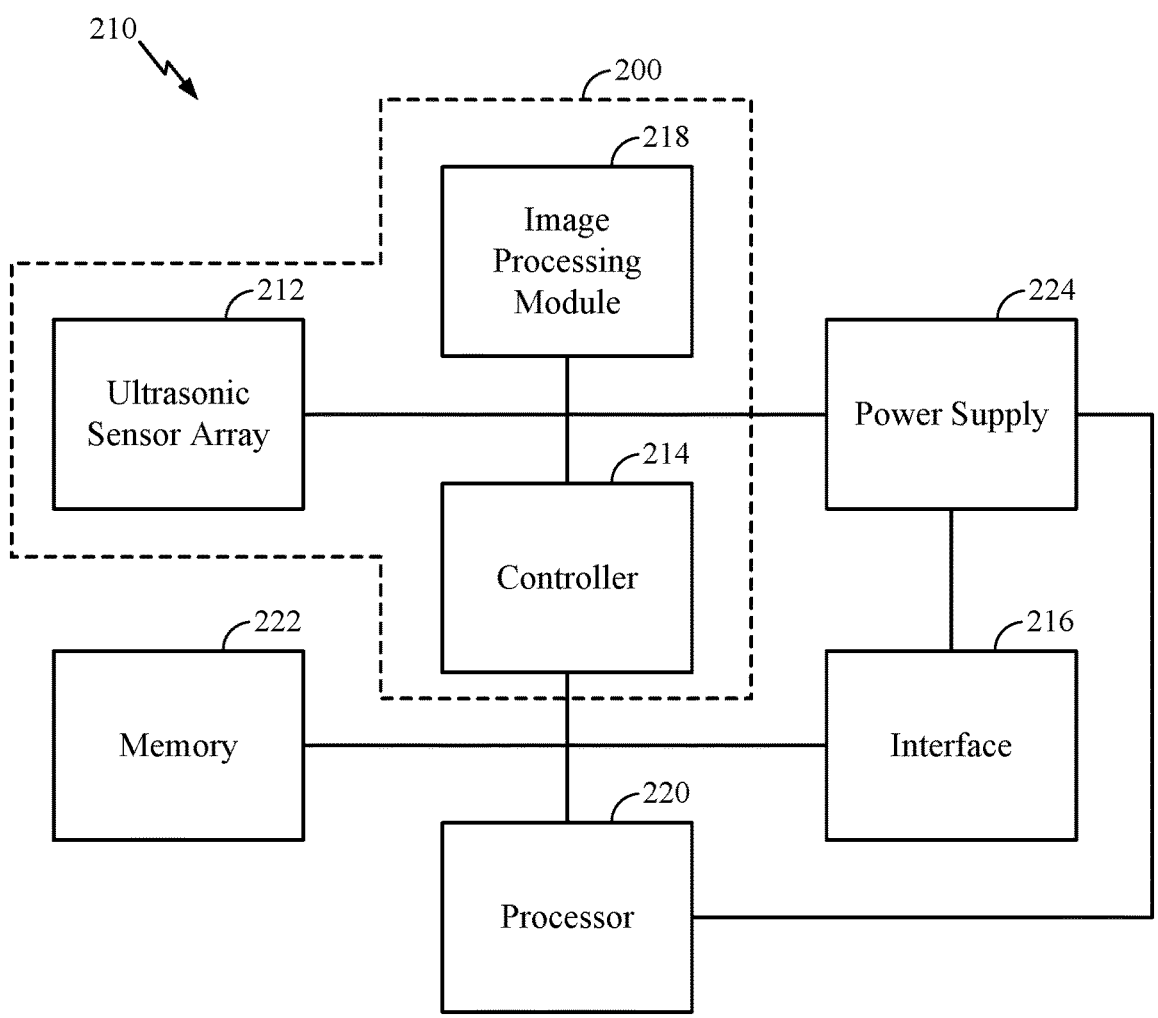
FIG. 2B shows a block diagram representation of components of an example mobile device that includes an ultrasonic sensing system.

FIG. 2B shows a block diagram representation of components of an example mobile device 210 that includes the ultrasonic sensing system 200 of FIG. 2A. For example, the mobile device 210 may be a block diagram representation of the mobile device 100 shown in and described with reference to FIG. 1. The sensor system 202 of the ultrasonic sensing system 200 of the mobile device 210 may be implemented with an ultrasonic sensor array 212. The control system 204 of the ultrasonic sensing system 200 may be implemented with a controller 214 that is electrically coupled to the ultrasonic sensor array 212. While the controller 214 is shown and described as a single component, in some implementations, the controller 214 may collectively refer to two or more distinct control units or processing units in electrical communication with one another.

The ultrasonic sensing system 200 of FIG. 2B may include an image processing module 218. In some implementations, raw measured image data provided by the ultrasonic sensor array 212 may be sent, transmitted, communicated, or otherwise provided to the image processing module 218. The image processing module 218 may include any suitable combination of hardware, firmware, and software configured, adapted, or otherwise operable to process the image data provided by the ultrasonic sensor array 212. In some implementations, the image processing module 218 may include signal or image processing circuits or circuit components including, for example, amplifiers (such as instrumentation amplifiers or buffer amplifiers), analog or digital mixers or multipliers, switches, analog-to-digital converters (ADCs), and/or passive or active analog filters, among others.

In some implementations, in addition to the ultrasonic sensing system 200, the mobile device 210 may include a separate processor 220, a memory 222, an interface 216, and a power supply 224. In some implementations, the controller 214 of the ultrasonic sensing system 200 may control the ultrasonic sensor array 212 and the image processing module 218, and the processor 220 of the mobile device 210 may control other components of the mobile device 210. In some implementations, the processor 220 communicates data to the controller 214 including, for example, instructions or commands. In some such implementations, the controller 214 may communicate data to the processor 220 including, for example, raw or processed image data.

Depending on the implementation, one or both of the controller 214 and processor 220 may store data in the memory 222. For example, the data stored in the memory 222 may include raw measured image data, filtered image data, or otherwise processed image data. The memory 222 may store processor-executable code or other executable computer-readable instructions capable of execution by one or both of the controller 214 and the processor 220 to perform various operations (or to cause other components such as the ultrasonic sensor array 212, the image processing module 218, or other modules to perform operations), including any of the operations described herein.

In some implementations, the controller 214 or the processor 220 may communicate data stored in the memory 222 or data received directly from the image processing module 218 through an interface 216 (e.g., corresponding to the interface system 206). For example, such communicated data can include image data or data derived or otherwise determined from image data. The interface 216 may collectively refer to one or more interfaces of one or more various types. In some implementations, the interface 216 may include a memory interface for receiving data from or storing data to an external memory such as a removable memory device. Additionally or alternatively, the interface 216 may include one or more wireless network interfaces or one or more wired network interfaces enabling the transfer of raw or processed data to, as well as the reception of data from, an external computing device, system, or server. A power supply 224 may provide power to some or all of the components in the mobile device 210.

Example Techniques for Capacitance Modulation to Mitigate Pixel Leakage in Ultrasonic Sensors Ultrasonic sensors (e.g., fingerprint sensors) sample and hold a received signal in a pixel of the ultrasonic sensor array (e.g., ultrasonic sensor array 212). As used herein, a pixel generally refers to circuitry associated with a portion of an ultrasonic sensor array. The held signal may be read by a receiver circuit (e.g., a receiver application specific integrated circuit (ASIC)) at a later time. The holding time of the received signal increases in proportion to the area of the ultrasonic sensor array. For example, during a transmission phase of the ultrasonic sensor, ultrasonic transmissions may occur for the sensor pixels, the reflections of which generate the received signals in each of the pixels that may be sampled and held. However, due to a limited read speed of sensed signals, the received signal at each pixel may be stored in the pixel during a hold phase until the receiver circuit of the fingerprint sensor reads the received signal at a later point in time.

The received signal may be stored in a capacitive element (e.g., gate-to-source capacitance ($C_{gs}$) and/or gate-to-drain capacitance ($C_{gd}$)) of a transistor in each pixel. The charge stored in the capacitive element of the transistor may discharge during the hold phase prior to the signal being read by the receiver circuit.

In some cases, the capacitance of the transistor's capacitive element may be increased to allow for a longer hold phase; however, increasing the capacitance of the transistor's capacitive element may result in degradation of the gain associated with the transistor. Moreover, a number of transmission phases of the sensor array may be increased. For example, a transmission phase may be used to sense and read half the pixels of the sensor array, and another transmission phase may be used to sense and read another half of the pixels of the sensor array, reducing the amount of time the sensed signal may be held before a signal is read (e.g., reducing the holding phase duration). However, increasing the number of transmission phases may cause signal artifacts and increase power consumption.

Certain aspects of the present disclosure are generally directed to a method for electrically modulating the capacitance of the transistor's capacitive element in the pixel. For example, the capacitance of the capacitive element may be increased during the hold phase, whereas the capacitance of the capacitive element may be set back to the nominal value during a read phase of the pixel. The increased capacitance of the transistor's capacitive element during the hold phase results in a higher leakage time-constant (e.g., resistive-capacitive (RC) time constant), reducing the signal leakage while causing little to no gain degradation associated with the transistor during a sensing phase.

Figure 3:
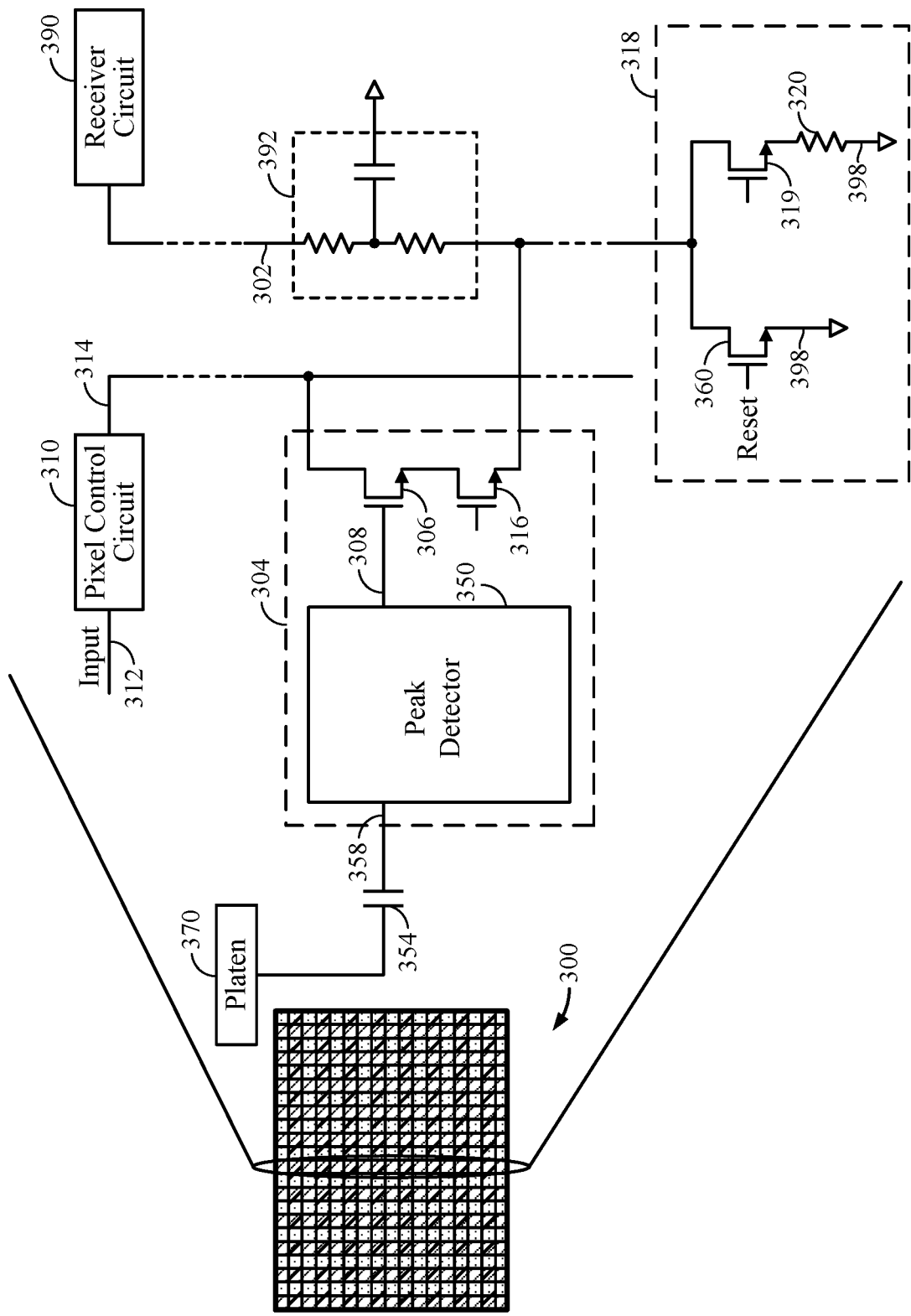
FIG. 3 illustrates a column line of a sensor array, in accordance with certain aspects of the present disclosure.

FIG. 3 illustrates a column line 302 of an ultrasonic sensor array 300 (e.g., corresponding to the ultrasonic sensor array 212 described with respect to FIG. 2B), in accordance with certain aspects of the present disclosure. The column line 302 corresponds to a column of the ultrasonic sensor array 300. As illustrated, the column line 302 is coupled to multiple pixels in the column of the ultrasonic sensor array 300, including pixel 304 having a transistor 306 (e.g., n-type metal-oxide-semiconductor (NMOS) transistor).

In certain aspects, a switch 316 (e.g., implemented as an NMOS transistor) may be coupled between the transistor 306 and the column line 302. The switch 316 may be a row select switch of the ultrasonic sensor array 300 (also referred to as a "pixel array"). The column line 302 may be coupled to column control circuit 318. The column control circuit 318 may include a transistor 319 and a resistive element 320. The transistor 319 may be biased to sink a current from the column line during a sensing phase (e.g., a voltage sensing phase) (also referred to as a "read phase") of the pixel array, forming a voltage at the column line 302 to be read by the receiver circuit 390 during the sensing phase. The column control circuit 318 may also include a switch 360 for resetting (e.g., discharging) the column line 302 after the sensing phase has completed.

As illustrated, a pixel control circuit 310 may be coupled to the pixel 304. For example, during the sensing phase, the pixel control circuit 310 may couple a drain of the transistor 306 to a voltage rail. Thus, during the sensing phase of the ultrasonic sensor array 300, the transistor 306 may be configured as a source follower, amplifying (e.g., buffering) a signal sampled and stored in a capacitive element of the transistor. The amplified signal may be read by the receiver circuit 390 coupled to the column line 302. In certain aspects, the column line 302 may include a parasitic element 392, as illustrated by the example representative circuit of series resistance and shunt capacitance.

The node 308 at the gate of the transistor 306 is the sample-and-hold node of the pixel 304. In other words, the sampled signal (also referred to herein as a "sensor signal") may be stored in the capacitive element(s) of the transistor 306 at the node 308. In certain aspects, a capacitive element 354 may be coupled between a platen 370 and the pixel 304. The capacitive element 354 may represent a capacitance of a piezoelectric layer between the platen 370 and the pixel 304.

As illustrated, the pixel 304 may include a peak detector circuit 350 configured to generate a signal at node 308 that represents the peak-to-peak voltage of the signal at node 358. The peak detector circuit may be coupled between node 308 and node 358.

Typically, the transistor 306 may be turned off during a hold phase. When the transistor 306 is turned off, no channel is formed in the transistor 306, and thus, the transistor 306 may have little to no capacitance for storing the sampled signal at node 308. In certain aspects of the present disclosure, the channel of the transistor 306 may be formed during the hold phase by coupling (e.g., via the pixel control circuit 310 and/or column control circuit 318) at least one of the drain or source of the transistor 306 to electric ground 398. As used herein, electric ground generally refers to any reference potential node.

In certain aspects, the pixel control circuit 310 may be implemented as an inverter. An input 312 of the inverter may be driven to logic high, such that the output 314 of the inverter is at electric ground potential during the hold phase. In other words, the drain of the transistor 306 is effectively coupled to electric ground by driving the input 312 of the inverter to logic high, forming a channel for the transistor 306 such that a capacitance of the transistor 306 is increased to effectively store a sampled signal during the hold phase. In certain aspects, the switch 316 may be open when the drain of the transistor 306 is coupled to electric ground. Thus, by coupling the drain of the transistor 306 to electric ground, both the source and the drain of the transistor 306 will be set to electric ground potential (e.g., after some settling time). Therefore, the gate voltage of the transistor 306 may be higher than the drain and source voltages of the transistor 306, forming a channel of the transistor 306, as described herein.

In certain aspects, the switch 316 and the switch 360 (e.g., of the column control circuit 318) may be closed such that the source of the transistor 306 is coupled to electric ground. In this case, the drain of the transistor 306 may be electrically floating by opening a switch (not shown) of the pixel control circuit 310. In other cases, both the drain and the source of the transistor 306 may be coupled to electric ground (e.g., via the pixel control circuit 310 and the column control circuit 318).

By setting at least one of the drain or the source of the transistor 306 to electric ground during the hold phase, the gate capacitance of the transistor 306 at node 308 increases, increasing the RC time constant associated with the discharge of the node 308 and reducing charge leakage. Thus, aspects of the present disclosure enable a relatively long hold time of a sample signal, making it practical to use only one transmit phase for a large-area sensor, saving power and avoiding artifacts compared to using multiple transmit phases for a single frame. In certain aspects, the various switches, column control circuit 318, and pixel control circuit 310 may be controlled via a controller (e.g., controller 214 of FIG. 2B) to implement the operations described herein.

Figure 4:
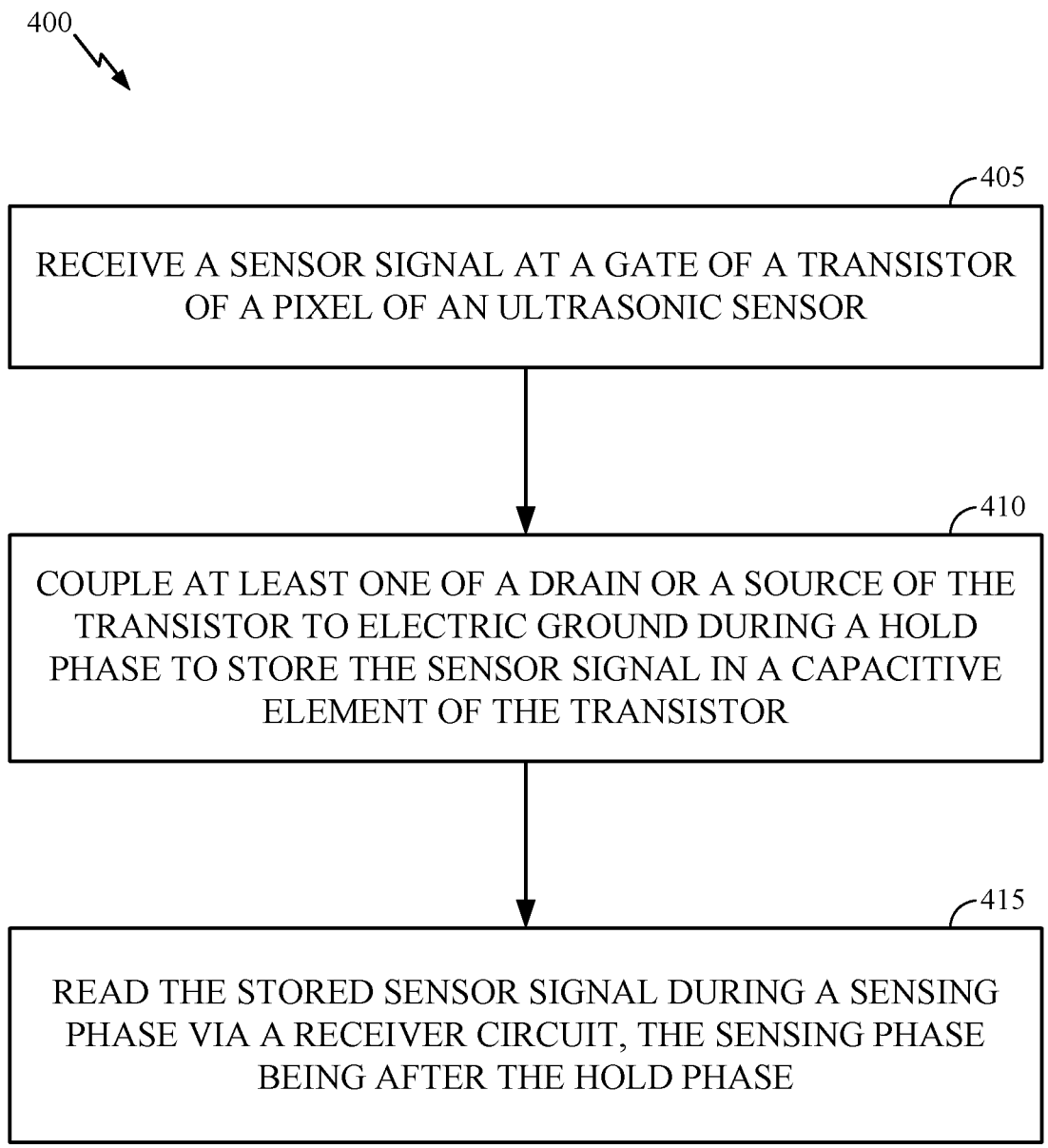
FIG. 4 is a flow diagram illustrating example operations for ultrasonic sensing, in accordance with certain aspects of the present disclosure.

FIG. 4 is a flow diagram illustrating example operations 400 for ultrasonic sensing, in accordance with certain aspects of the present disclosure. The operations 400 may be performed, for example, by an ultrasonic sensing system, which may include an ultrasonic sensor array (e.g., the ultrasonic sensor array 300) and/or a controller, such as the controller 214.

The operations 400 may begin, at block 405, with the ultrasonic sensing system receiving a sensor signal at a gate of a transistor (e.g., transistor 306) of a pixel (e.g., pixel 304) of an ultrasonic sensor (e.g., ultrasonic sensor array 300), and at block 410, coupling at least one of a drain or a source of the transistor to electric ground (e.g., electric ground 398) during a hold phase to store the sensor signal in a capacitive element (e.g., a gate-to-source capacitance or a gate-to-drain capacitance) of the transistor. In certain aspects, coupling the at least one of the drain or the source of the transistor to the electric ground may include closing at least one switch coupled between the source of the transistor and the electric ground. For example, the at least one switch may include a first switch (e.g., switch 316) coupled between the transistor and a column line (e.g., column line 302) of the ultrasonic sensor and a second switch (e.g., switch 360) coupled between the column line and the electric ground. At block 415, the ultrasonic sensing system may read the stored sensor signal during a sensing phase via a receiver circuit, the sensing phase being after the hold phase. In certain aspects, the operations 400 may also include coupling the drain of the transistor to a voltage rail during the sensing phase.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering. In certain aspects, means for receiving may comprise any processing circuitry, such as the capacitive element 354. Means for coupling and means for closing may comprise a switch, such as the switch 360, and/or a control circuit, such as the pixel control circuit 310 or controller 214. Means for reading may include a receiver circuit, such as the receiver circuit 390.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with discrete hardware components designed to perform the functions described herein. The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. An ultrasonic sensor comprising:
a column line;

a pixel having a transistor coupled to the column line;
a pixel control circuit coupled to a drain of the transistor of the pixel;
a column control circuit coupled to a source of the transistor, wherein at least one of the pixel control circuit or the column control circuit is configured to couple at least one of the drain or the source of the transistor, respectively, to an electric ground during a hold phase of the ultrasonic sensor; and
a receiver circuit coupled to the column line.

2. The ultrasonic sensor of claim 1, wherein the column control circuit comprises a first switch configured to couple the source of the transistor to the electric ground during the hold phase.

3. The ultrasonic sensor of claim 2, wherein the pixel further comprises a second switch coupled between the source of the transistor and the column line, the second switch being closed when the source of the transistor is coupled to the electric ground during the hold phase.

4. The ultrasonic sensor of claim 1, wherein the pixel control circuit is configured to couple the drain of the transistor to a voltage rail during a sensing phase of the ultrasonic sensor.

5. The ultrasonic sensor of claim 4, wherein a sensed signal is stored in a capacitive element of the transistor during the hold phase, the receiver circuit being configured to read the sensed signal stored in the capacitive element during the sensing phase.

6. The ultrasonic sensor of claim 5, wherein the capacitive element of the transistor comprises at least one of a gate-to-source capacitance of the transistor or a gate-to-drain capacitance of the transistor.

7. The ultrasonic sensor of claim 5, wherein a capacitance of the capacitive element increases during the hold phase of the ultrasonic sensor by coupling the at least one of the drain or the source of the transistor to electric ground.

8. The ultrasonic sensor of claim 1, further comprising a peak detector circuit coupled between a platen and a gate of the transistor.

9. The ultrasonic sensor of claim 1, wherein the transistor comprises an n-type metal-oxide-semiconductor (NMOS) transistor.

10. The ultrasonic sensor of claim 1, wherein the ultrasonic sensor is configured as a fingerprint sensor.

11. A method for ultrasonic sensing, comprising:
receiving a sensor signal at a gate of a transistor of a pixel of an ultrasonic sensor;
coupling at least one of a drain or a source of the transistor to an electric ground during a hold phase to store the sensor signal in a capacitive element of the transistor; and
reading the stored sensor signal during a sensing phase via a receiver circuit, the sensing phase being after the hold phase.

12. The method of claim 11, wherein coupling the at least one of the drain or the source of the transistor to the electric ground comprises closing at least one switch coupled between the source of the transistor and the electric ground.

13. The method of claim 12, wherein the at least one switch comprises:
a first switch coupled between the source of the transistor and a column line of the ultrasonic sensor; and
a second switch coupled between the column line and the electric ground.

14. The method of claim 11, further comprising coupling the drain of the transistor to a voltage rail during the sensing phase.

15. The method of claim 11, wherein the capacitive element of the transistor comprises at least one of a gate-to-source capacitance of the transistor or a gate-to-drain capacitance of the transistor.

16. The method of claim 11, wherein the transistor comprises an n-type metal-oxide-semiconductor (NMOS) transistor.

17. An apparatus for ultrasonic sensing, comprising:
means for receiving a sensor signal at a gate of a transistor of a pixel of the apparatus;
means for coupling at least one of a drain or a source of the transistor to an electric ground during a hold phase to store the sensor signal in a capacitive element of the transistor; and
means for reading the stored sensor signal during a sensing phase, the sensing phase being after the hold phase.

18. The apparatus of claim 17, wherein the means for coupling comprises means for closing at least one switch coupled between the source of the transistor and the electric ground.

19. The apparatus of claim 17, further comprising means for coupling the drain of the transistor to a voltage rail during the sensing phase.

20. The apparatus of claim 17, wherein the capacitive element of the transistor comprises at least one of a gate-to-source capacitance of the transistor or a gate-to-drain capacitance of the transistor.

* * * * *